(12) United States Patent  (10) Patent No.: US 8,110,822 B2
Chen  (45) Date of Patent: Feb. 7, 2012

(54) THERMAL PROTECT PCRAM STRUCTURE AND METHODS FOR MAKING

(75) Inventor: Shih-Hung Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 183 days.

(21) Appl. No.: 12/503,624

(22) Filed: Jul. 15, 2009

(65) Prior Publication Data

US 2011/0012079 A1 Jan. 20, 2011

(51) Int. Cl.
*H01L 47/00* (2006.01)

(52) U.S. Cl. ............ 257/4; 257/2; 257/E45.002; 438/95

(58) Field of Classification Search ........... 257/E31.029, 257/4
See application file for complete search history.

(56) References Cited

U.S. PATENT DOCUMENTS

| | | | |
|---|---|---|---|
| 3,271,591 A | 9/1966 | Ovshinsky |
| 3,530,441 A | 9/1970 | Ovshinsky |
| 3,846,767 A | 11/1974 | Cohen |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |

(Continued)

FOREIGN PATENT DOCUMENTS

JP    2007067403 A  *  3/2007

(Continued)

OTHER PUBLICATIONS

Daily, James. Packaging of Electronic Systems. 1990. McGraw-Hill Publishing Company. pp. 129-135.*

(Continued)

*Primary Examiner* — Ajay K Arora

(74) *Attorney, Agent, or Firm* — Haynes Beffel & Wolfeld LLP

(57) ABSTRACT

A memory cell as described herein includes a conductive contact and a memory element comprising programmable resistance memory material overlying the conductive contact. An insulator element extends from the conductive contact into the memory element, the insulator element having proximal and distal ends and an inside surface defining an interior. The proximal end is adjacent the conductive contact. A bottom electrode contacts the conductive contact and extends upwardly within the interior from the proximal end. The memory element is within the interior extending downwardly from the distal end to contact a top surface of the bottom electrode at a first contact surface. A top electrode can be separated from the distal end of the insulator element by the memory element and contact the memory element at a second contact surface having a surface area greater than that of the first contact surface.

19 Claims, 9 Drawing Sheets

U.S. PATENT DOCUMENTS

| | | | |
|---|---|---|---|
| 5,716,883 | A | 2/1998 | Tseng et al. |
| 5,754,472 | A | 5/1998 | Sim et al. |
| 5,789,277 | A | 8/1998 | Zahorik et al. |
| 5,789,758 | A | 8/1998 | Reinberg |
| 5,814,527 | A | 9/1998 | Wolstenholme et al. |
| 5,831,276 | A | 11/1998 | Gonzalez et al. |
| 5,837,564 | A | 11/1998 | Sandhu et al. |
| 5,869,843 | A | 2/1999 | Harshfield |
| 5,879,955 | A | 3/1999 | Gonzalez et al. |
| 5,902,704 | A | 5/1999 | Schoenborn et al. |
| 5,920,788 | A | 7/1999 | Reinberg |
| 5,933,365 | A | 8/1999 | Klersy et al. |
| 5,952,671 | A | 9/1999 | Reinberg et al. |
| 5,958,358 | A | 9/1999 | Tenne et al. |
| 5,970,336 | A | 10/1999 | Wolstenholme et al. |
| 5,985,698 | A | 11/1999 | Gonzalez et al. |
| 5,998,244 | A | 12/1999 | Wolstenholme et al. |
| 6,011,725 | A | 1/2000 | Eitan |
| 6,025,220 | A | 2/2000 | Sandhu |
| 6,031,287 | A | 2/2000 | Harshfield |
| 6,034,882 | A | 3/2000 | Johnson et al. |
| 6,046,951 | A | 4/2000 | El Hajji et al. |
| 6,066,870 | A | 5/2000 | Siek |
| 6,075,719 | A | 6/2000 | Lowrey et al. |
| 6,077,674 | A | 6/2000 | Schleifer et al. |
| 6,077,729 | A | 6/2000 | Harshfield |
| 6,087,269 | A | 7/2000 | Williams |
| 6,087,674 | A | 7/2000 | Ovshinsky et al. |
| 6,104,038 | A | 8/2000 | Gonzalez et al. |
| 6,111,264 | A | 8/2000 | Wolstenholme et al. |
| 6,114,713 | A | 9/2000 | Zahorik |
| 6,117,720 | A | 9/2000 | Harshfield |
| 6,147,395 | A | 11/2000 | Gilgen |
| 6,150,253 | A | 11/2000 | Doan et al. |
| 6,153,890 | A | 11/2000 | Wolstenholme et al. |
| 6,177,317 | B1 | 1/2001 | Huang et al. |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,280,684 | B1 | 8/2001 | Yamada et al. |
| 6,287,887 | B1 | 9/2001 | Gilgen |
| 6,291,137 | B1 | 9/2001 | Lyons et al. |
| 6,314,014 | B1 | 11/2001 | Lowrey et al. |
| 6,316,348 | B1 | 11/2001 | Fu et al. |
| 6,320,786 | B1 | 11/2001 | Chang et al. |
| 6,326,307 | B1 | 12/2001 | Lindley et al. |
| 6,337,266 | B1 | 1/2002 | Zahorik |
| 6,339,544 | B1 | 1/2002 | Chiang et al. |
| 6,351,406 | B1 | 2/2002 | Johnson et al. |
| 6,372,651 | B1 | 4/2002 | Yang et al. |
| 6,380,068 | B2 | 4/2002 | Jeng et al. |
| 6,420,215 | B1 | 7/2002 | Knall et al. |
| 6,420,216 | B1 | 7/2002 | Clevenger et al. |
| 6,420,725 | B1 | 7/2002 | Harshfield |
| 6,423,621 | B2 | 7/2002 | Doan et al. |
| 6,429,064 | B1 | 8/2002 | Wicker |
| 6,440,837 | B1 | 8/2002 | Harshfield |
| 6,462,353 | B1 | 10/2002 | Gilgen |
| 6,483,736 | B2 | 11/2002 | Johnson et al. |
| 6,487,106 | B1 | 11/2002 | Kozicki |
| 6,487,114 | B2 | 11/2002 | Jong et al. |
| 6,501,111 | B1 | 12/2002 | Lowrey |
| 6,511,867 | B2 | 1/2003 | Lowrey et al. |
| 6,512,241 | B1 | 1/2003 | Lai |
| 6,512,263 | B1 | 1/2003 | Yuan et al. |
| 6,514,788 | B2 | 2/2003 | Quinn |
| 6,514,820 | B2 | 2/2003 | Ahn et al. |
| 6,534,781 | B2 | 3/2003 | Dennison |
| 6,545,903 | B1 | 4/2003 | Wu |
| 6,551,866 | B1 | 4/2003 | Maeda et al. |
| 6,555,860 | B2 | 4/2003 | Lowrey et al. |
| 6,563,156 | B2 | 5/2003 | Harshfield |
| 6,566,700 | B2 | 5/2003 | Xu |
| 6,567,293 | B1 | 5/2003 | Lowrey et al. |
| 6,576,546 | B2 | 6/2003 | Gilbert et al. |
| 6,579,760 | B1 | 6/2003 | Lung |
| 6,586,761 | B2 | 7/2003 | Lowrey |
| 6,589,714 | B2 | 7/2003 | Maimon et al. |
| 6,593,176 | B2 | 7/2003 | Dennison |
| 6,596,589 | B2 | 7/2003 | Tseng et al. |
| 6,597,009 | B2 | 7/2003 | Wicker |
| 6,605,527 | B2 | 8/2003 | Dennison et al. |
| 6,605,821 | B1 | 8/2003 | Lee et al. |
| 6,607,974 | B2 | 8/2003 | Harshfield |
| 6,613,604 | B2 | 9/2003 | Maimon et al. |
| 6,617,192 | B1 | 9/2003 | Lowrey et al. |
| 6,621,095 | B2 | 9/2003 | Chiang et al. |
| 6,627,530 | B2 | 9/2003 | Li et al. |
| 6,639,849 | B2 | 10/2003 | Takahashi et al. |
| 6,673,700 | B2 | 1/2004 | Dennison et al. |
| 6,674,115 | B2 | 1/2004 | Hudgens et al. |
| 6,677,678 | B2 | 1/2004 | Biolsi et al. |
| 6,744,088 | B1 | 6/2004 | Dennison |
| 6,750,079 | B2 | 6/2004 | Lowrey et al. |
| 6,750,101 | B2 | 6/2004 | Lung et al. |
| 6,791,102 | B2 | 9/2004 | Johnson et al. |
| 6,797,979 | B2 | 9/2004 | Chiang et al. |
| 6,800,504 | B2 | 10/2004 | Li et al. |
| 6,800,563 | B2 | 10/2004 | Xu |
| 6,815,704 | B1 | 11/2004 | Chen |
| 6,838,692 | B1 | 1/2005 | Lung et al. |
| 6,850,432 | B2 | 2/2005 | Lu et al. |
| 6,859,389 | B2 | 2/2005 | Idehara |
| 6,861,267 | B2 | 3/2005 | Xu et al. |
| 6,864,500 | B2 | 3/2005 | Gilton |
| 6,864,503 | B2 | 3/2005 | Lung |
| 6,867,638 | B2 | 3/2005 | Saiki et al. |
| 6,881,603 | B2 | 4/2005 | Lai |
| 6,888,750 | B2 | 5/2005 | Walker et al. |
| 6,894,304 | B2 | 5/2005 | Moore |
| 6,894,305 | B2 | 5/2005 | Yi et al. |
| 6,900,517 | B2 | 5/2005 | Tanaka et al. |
| 6,903,362 | B2 | 6/2005 | Wyeth et al. |
| 6,909,107 | B2 | 6/2005 | Rodgers et al. |
| 6,910,907 | B2 | 6/2005 | Layadi et al. |
| 6,927,410 | B2 | 8/2005 | Chen |
| 6,928,022 | B2 | 8/2005 | Cho et al. |
| 6,933,516 | B2 | 8/2005 | Xu |
| 6,936,544 | B2 | 8/2005 | Huang et al. |
| 6,936,840 | B2 | 8/2005 | Sun et al. |
| 6,937,507 | B2 | 8/2005 | Chen |
| 6,943,365 | B2 | 9/2005 | Lowrey et al. |
| 6,969,866 | B1 | 11/2005 | Lowrey et al. |
| 6,972,428 | B2 | 12/2005 | Maimon |
| 6,972,430 | B2 | 12/2005 | Casagrande et al. |
| 6,977,181 | B1 | 12/2005 | Raberg et al. |
| 6,992,932 | B2 | 1/2006 | Cohen |
| 6,998,289 | B2 | 2/2006 | Hudgens et al. |
| 7,023,008 | B1 | 4/2006 | Happ |
| 7,023,009 | B2 | 4/2006 | Kostylev et al. |
| 7,033,856 | B2 | 4/2006 | Lung et al. |
| 7,038,230 | B2 | 5/2006 | Chen et al. |
| 7,038,938 | B2 | 5/2006 | Kang et al. |
| 7,042,001 | B2 | 5/2006 | Kim et al. |
| 7,054,183 | B2 | 5/2006 | Rinerson et al. |
| 7,067,837 | B2 | 6/2006 | Hwang et al. |
| 7,067,864 | B2 | 6/2006 | Nishida et al. |
| 7,067,865 | B2 | 6/2006 | Lung et al. |
| 7,078,273 | B2 | 7/2006 | Matsuoka et al. |
| 7,099,180 | B1 | 8/2006 | Dodge et al. |
| 7,115,927 | B2 | 10/2006 | Hideki et al. |
| 7,122,281 | B2 | 10/2006 | Pierrat |
| 7,122,824 | B2 | 10/2006 | Khouri et al. |
| 7,126,149 | B2 | 10/2006 | Iwasaki et al. |
| 7,126,847 | B2 | 10/2006 | Ha et al. |
| 7,132,675 | B2 | 11/2006 | Gilton |
| 7,151,273 | B2 | 12/2006 | Campbell et al. |
| 7,154,774 | B2 | 12/2006 | Bedeschi et al. |
| 7,158,411 | B2 | 1/2007 | Yeh et al. |
| 7,164,147 | B2 | 1/2007 | Lee et al. |
| 7,166,533 | B2 | 1/2007 | Happ |
| 7,169,635 | B2 | 1/2007 | Kozicki |
| 7,202,493 | B2 | 4/2007 | Lung et al. |
| 7,208,751 | B2 | 4/2007 | Ooishi et al. |
| 7,214,958 | B2 | 5/2007 | Happ |

| Patent/Publication | Date | Inventor |
|---|---|---|
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,262,502 B2 | 8/2007 | Chang |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,314,776 B2 | 1/2008 | Johnson et al. |
| 7,317,201 B2 | 1/2008 | Gutsche et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,463,512 B2 | 12/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,502,252 B2 | 3/2009 | Fuji et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 7,569,844 B2 | 8/2009 | Lung |
| 7,619,311 B2 | 11/2009 | Lung |
| 7,635,855 B2 | 12/2009 | Chen et al. |
| 7,646,631 B2 | 1/2010 | Lung |
| 7,663,135 B2 | 2/2010 | Lung |
| 2002/0017701 A1 | 2/2002 | Klersy et al. |
| 2002/0070457 A1 | 6/2002 | Sun et al. |
| 2002/0113273 A1 | 8/2002 | Hwang et al. |
| 2002/0168852 A1 | 11/2002 | Harshfield et al. |
| 2003/0071289 A1* | 4/2003 | Hudgens et al. ............ 257/246 |
| 2003/0072195 A1 | 4/2003 | Mikolajick |
| 2003/0095426 A1 | 5/2003 | Hush et al. |
| 2003/0116794 A1 | 6/2003 | Lowrey |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127347 A1 | 6/2005 | Choi et al. |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0018156 A1 | 1/2006 | Happ |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0169968 A1 | 8/2006 | Happ |
| 2006/0172067 A1 | 8/2006 | Ovshinsky et al. |
| 2006/0175599 A1 | 8/2006 | Happ |
| 2006/0192193 A1 | 8/2006 | Lee et al. |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0045606 A1 | 3/2007 | Magistretti et al. |
| 2007/0048945 A1 | 3/2007 | Czubatyj et al. |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1* | 5/2007 | Lung ................................ 257/4 |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1* | 6/2007 | Lung ............................ 257/246 |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1* | 7/2007 | Lai et al. .......................... 257/4 |
| 2007/0158645 A1 | 7/2007 | Lung |

| | | |
|---|---|---|
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0106923 A1 | 5/2008 | Lung |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2008/0303014 A1 | 12/2008 | Goux et al. |
| 2008/0310208 A1 | 12/2008 | Daley |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0098678 A1 | 4/2009 | Lung |
| 2009/0122588 A1 | 5/2009 | Chen |
| 2009/0166603 A1 | 7/2009 | Lung |
| 2009/0194758 A1 | 8/2009 | Chen |
| 2009/0268507 A1 | 10/2009 | Breitwisch et al. |
| 2009/0289242 A1 | 11/2009 | Breitwisch et al. |
| 2009/0294748 A1 | 12/2009 | Breitwisch et al. |

FOREIGN PATENT DOCUMENTS

WO 2004025659 A1 3/2004

OTHER PUBLICATIONS

"Magnetic Bit Boost," www.sciencenews.org, Dec. 18 & 25, 2004, p. 389, vol. 166.

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM Dec. 13-15, 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published at least as early as Dec. 1997, pp. 1-6.

Bedeschi, F. et al., "4-MB MOSFET-Selected Phase-Change Memory Experimental Chip," IEEE, Sep. 21-23, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," Jun. 10-21, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming, "Temperature dependence on the contact size of GeSbTe films for phase change memories," J. Comput Electron (2008) 7:138-141.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

\* cited by examiner

THERMAL PROTECT PCRAM STRUCTURE AND METHODS FOR MAKING

PARTIES TO A JOINT RESEARCH AGREEMENT

International Business Machines Corporation, a New York corporation, Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to memory devices based on phase change memory materials, including chalcogenide based materials and other programmable resistance materials, and methods for manufacturing such devices.

2. Description of Related Art

Phase change based memory materials, like chalcogenide based materials and similar materials, can be caused to change phase between an amorphous and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistance material to form nonvolatile memory circuits, which can be read and written with random access.

The change from the amorphous to the crystalline, referred to as set herein, is generally a lower current operation in which current heats the phase change material above a transition temperature to cause a transition of an active region from the amorphous to the crystalline phase. The change from the crystalline to the amorphous, referred to as reset herein, is generally a higher current operation, which includes a short high current density pulse to melt or breakdown the crystalline structure, after which phase change material cools quickly, quenching the phase change process and allowing at least a portion of the active region of the phase change material to stabilize in the amorphous phase. Techniques are applied to make the active region small, so that the amount of current needed to induce the phase change is reduced.

The magnitude of the current needed can be reduced by reducing the size of the phase change material element and/or the size of electrodes in contact with the phase change material element, so that higher current densities are achieved in the active region with small absolute current values.

One approach to controlling the size of the active region is to devise very small electrodes for delivering current to a body of phase change material. This small electrode structure concentrates current in a small area like the head of a mushroom, at the location of the contact. See, U.S. Pat. No. 6,429,064, issued Aug. 6, 2002 to Wicker, "Reduced Contact Areas of Sidewall Conductor"; U.S. Pat. No. 6,462,353, issued Oct. 8, 2002, to Gilgen, "Method for Fabricating a Small Area of Contact Between Electrodes"; U.S. Pat. No. 6,501,111, issued Dec. 31, 2002, to Lowrey, "Three-Dimensional (3D) Programmable Device"; U.S. Pat. No. 6,563,156, issued Jul. 1, 2003, to Harshfield, "Memory Elements and Methods for Making Same".

Another approach to controlling the size of the active region includes spacing the electrodes in such a way that current flowing therebetween is concentrated by the thickness of a thin layer of phase change material. See, U.S. Patent Application Publication No. US 2007/0048945, entitled "Memory Device and Method of Making Same", by Czubatyj, et al. See also the following applications and patents commonly owned by the assignee of the present application: U.S. patent application Ser. No. 11/864,273, filed 28 Sep. 2007, entitled "Memory Cell Having A Side Electrode Contact", by Lung; U.S. Pat. No. 7,463,512, issued 9 Dec. 2008, entitled "Memory Element with Reduced-Current Phase Change Element", by Lung; U.S. application Ser. No. 12/023,978, filed 7 Aug. 2008, entitled "Memory Cell Device with Coplanar Electrode Surface and Method", by Lung.

A specific issue arising from conventional phase change memory cell structures is the heat sink effect of electrodes in contact with the phase change material. Because the phase change occurs as a result of heating, the thermal conductivity of the electrodes will act to draw heat away from the active region, resulting in a need for a higher current to induce the desired phase change.

Higher current levels can result in electrical and mechanical reliability problems for the memory cell. These problems include the formation of voids at the phase change material/electrode interface due to mechanical stress caused by thermal expansion and material density changes during operation.

Additionally, higher current levels can result in problems such as localized heating sufficient to induce diffusion/reaction of electrode and phase change material, and/or cause compositional changes in the phase change material within the active region, resulting in resistive switching performance degradation and possible failure of the memory cell.

Thus, various techniques are used in an attempt to thermally isolate the active region so that the resistive heating needed to induce the phase change is confined to the active region.

One approach to improving thermal isolation includes using gaps or voids adjacent the phase change material. See U.S. Pat. No. 6,815,704, issued 9 Nov. 2004, entitled "Phase Change Memory Device Employing Thermally Insulating Voids", by Chen.

It has also been proposed to use thermally insulating materials to improve the confinement of heat to the active region. See, for example, U.S. patent application Ser. No. 11/940164, filed 14 Nov. 2007, entitled "Phase Change Memory Cell Including Thermal Protect Bottom Electrode and Manufacturing Methods", by Chen.

Another approach to improving thermal isolation includes forming the phase change material and electrodes in a way that tends to space the active region from the electrodes. See the following applications commonly owned by the assignee of the present application: U.S. patent application Ser. No. 11/348,848, filed 7 Sep. 2006, entitled "I-Shaped Phase Change Memory Cell", by Chen et al.; U.S. patent application Ser. No. 11/952646, filed 7 Dec. 2007, entitled "Phase Change Memory Cell Having Interface Structures with Essentially Equal thermal Impedances and Manufacturing Methods", by Lung; U.S. application Ser. No. 12/026342, filed 5 Feb. 2005, entitled "Heating Center PCRAM Structure and Methods for Making", by Chen.

Accordingly, an opportunity arises to devise phase change memory cell structures requiring a small amount of current to induce phase change in the active region. Furthermore, it is desirable to provide methods for manufacturing such devices.

SUMMARY OF THE INVENTION

Phase change based memory cells having small operational currents are described herein. The memory cells described herein reduce the amount of heat drawn away from the active region of the memory element, effectively increasing the amount of heat generated within the active region per unit value of current and thus reducing the amount of current required to induce phase change.

A memory cell as described herein includes a conductive contact and a memory element comprising programmable resistance memory material overlying the conductive contact. An insulator element extends from the conductive contact into the memory element, the insulator element having proximal and distal ends and an inside surface defining an interior. The proximal end is adjacent the conductive contact. A bottom electrode contacts the conductive contact and extends upwardly within the interior from the proximal end. Memory material of the memory element is within the interior extending downwardly from the distal end to contact a top surface of the bottom electrode at a first contact surface. A top electrode can be separated from the distal end of the insulator element by memory material of the memory element and contacts the memory element at a second contact surface. The second contact surface can have a surface area greater than that of the first contact surface.

The active region is the region of the memory element within the interior in which the memory material is induced to change between at least two solid phases. As can be appreciated, the active region can be made extremely small, thus reducing the magnitude of the current needed to induce a phase change. The width of the interior is less than the width of the memory element and the top electrode, the width of the interior preferably less than a minimum feature size for a process, typically a lithographic process, used to form the memory cell. The difference in widths concentrates current in the portion of the memory element within the upper portion of the interior, thereby reducing the magnitude of current needed to induce a phase change in the active region.

In addition, the bottom electrode can act as a heater, because of its high resistivity in certain embodiments, inducing a greater temperature change in the active region for a given current flow than would otherwise occur, thus improving the efficiency of the phase change in the active region.

Furthermore, the small width of the bottom electrode provides a high thermal resistance path through the bottom electrode, thus restricting the amount of heat flow away from the active region of the memory element through the bottom electrode.

Since the insulator element extends into the memory element and in embodiments has a bottom surface lying below the top surface of the bottom electrode, the active region is inside the volume of memory material of the memory element. The remaining portions of the memory element can therefore provide thermal isolation to the active region, which reduces the amount of current necessary to induce a phase change. In addition, having the active region within the upper portion of the interior, and thus spaced away from the outside surfaces of memory element, prevents etch damage issues to the active region.

The insulator element can also provide some thermal isolation to the active region. Additionally, the insulator element can be formed on a sidewall using thin film deposition techniques, and thus the thickness of the element can be very small. The small thickness increases the thermal resistance of the sidewall insulator element, which restricts heat flow away from the active region by the sidewall insulator element and thereby helps to concentrates the heat flow to within the material of the memory element.

Other aspects and advantages of the present invention can be seen on review of the drawings, the detailed description, and the claims which follow.

DETAILED DESCRIPTION

A detailed description of embodiments of the present invention is provided with reference to the FIGS. 1-11.

Figure 1:
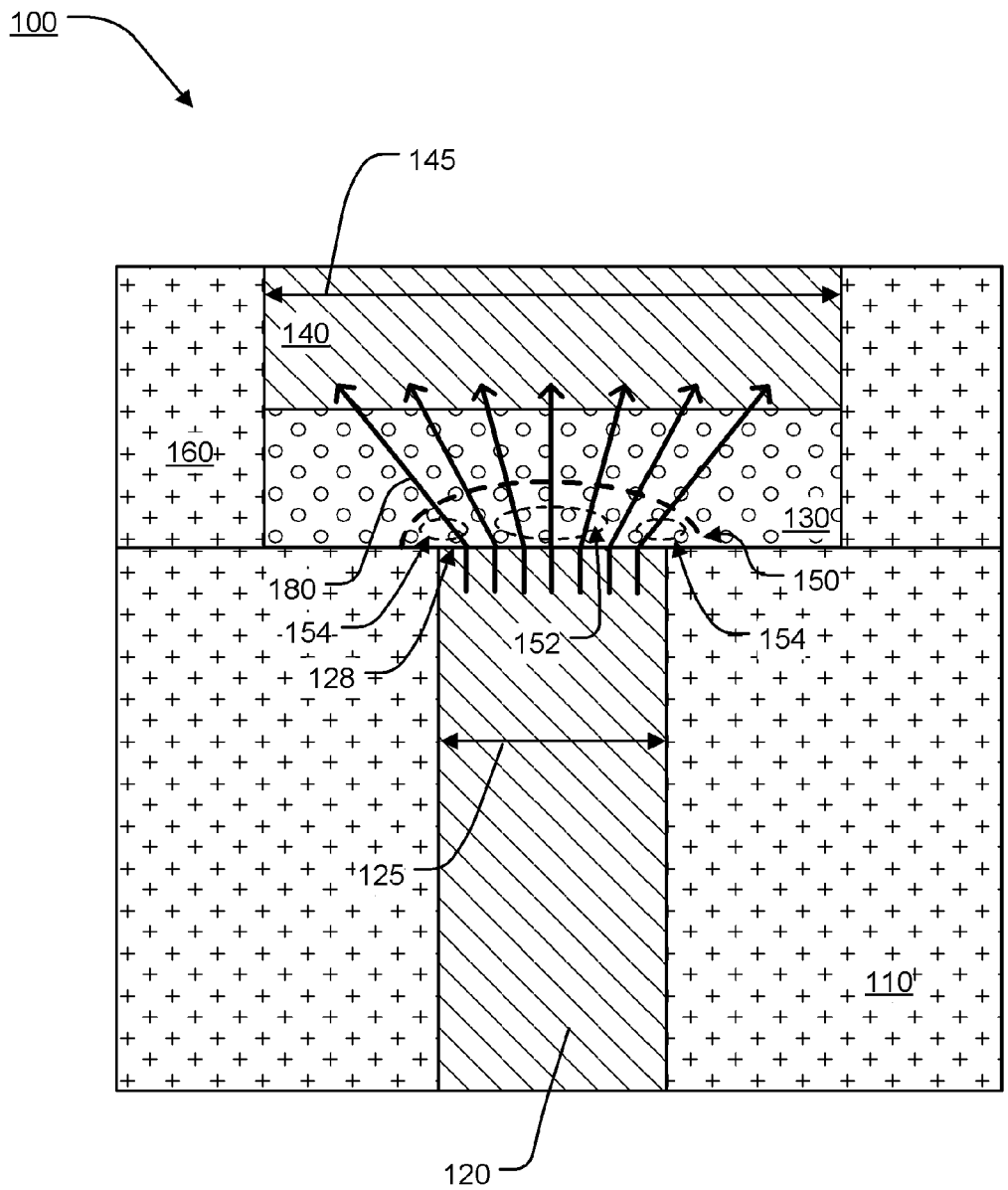
FIG. 1 illustrates a cross-sectional view of a prior art "mushroom-type" memory cell.

FIG. 1 illustrates a cross-sectional view of a prior art "mushroom-type" memory cell 100 having a bottom electrode 120 extending through a dielectric layer 110, a phase change memory element 130 comprising a layer of phase change material on the bottom electrode 120, and a top electrode 140 on the phase change memory element 130. A dielectric layer 160 surrounds the phase change memory element 130. As can be seen in FIG. 1, the bottom electrode 120 has a width 125 less than the width 145 of the top electrode 140 and phase change material 130.

In operation, voltages on the top and bottom electrodes 140, 120 induce a current to flow from the top electrode 140 to the bottom electrode 120, or vice-versa, via the phase change memory element 130.

The active region 150 is the region of the phase change memory element 130 in which the phase change material is induced to change between at least two solid phases. Due to the differences in the widths 125 and 145, the current flow path 180 from the bottom electrode 120 to the top electrode 140 is concentrated in the region of the phase change memory element 130 adjacent the bottom electrode 120, resulting in the active region 150 having a "mushroom" shape as shown in FIG. 1.

It is desirable to minimize the width 125 of the bottom electrode 120 so that higher current densities are achieved with small absolute current values through the memory element 130. However, attempts to reduce the width 125 of the bottom electrode 120 can result in issues in the electrical and mechanical reliability of the interface 128 between the bottom electrode 120 and the memory element 130 due to the small contact surface therebetween.

In operation, due to the differences in widths 125 and 145 the current is concentrated at the contact surface 128 between the bottom electrode 120 and the phase change memory element 130. In addition, as indicated by the arrows of path 180, the current flow from the contact surface 128 spreads laterally and vertically within the phase change memory element 130. As a result, the current density within the phase change memory element 130 deceases with distance away from the contact surface 128 in both the lateral and vertical directions. This decrease in current density caused by the current spreading within the memory element 130 results in a need for higher current to induce the desired phase change in the active region 150.

The current density and thus the heat generated at the center 152 of the active region 150 is much larger than at the edges 154 of the active region 150. As a result, when the edges 154 of the active region 150 are heated to a temperature sufficient to induce the desired phase change, the center 152 can experience localized heating sufficient to cause electrical and mechanical reliability problems for the memory cell 100.

These problems can include the formation voids at the interface 128 between the phase change memory element 130 and the bottom electrode 120 due to mechanical stress caused by thermal expansion and material density changes during operation. In addition, the center 152 may experience localized heating sufficient to induce diffusion/reaction of material of the bottom electrode 120 and the phase change material 130, and/or may cause compositional changes in the phase change material 130 at the center 154. These problems can result in resistive switching performance degradation and possible failure of the memory cell 100.

Additionally, because the phase change in the active region 150 occurs as a result of heating, the thermal conductivity of the bottom electrode 120 and dielectric 110 will act to draw heat away from the active region 150 and result in a significant amount of heat loss. The high heat loss results in a need for a higher current to induce the desired change in the active region 150.

Figure 2:
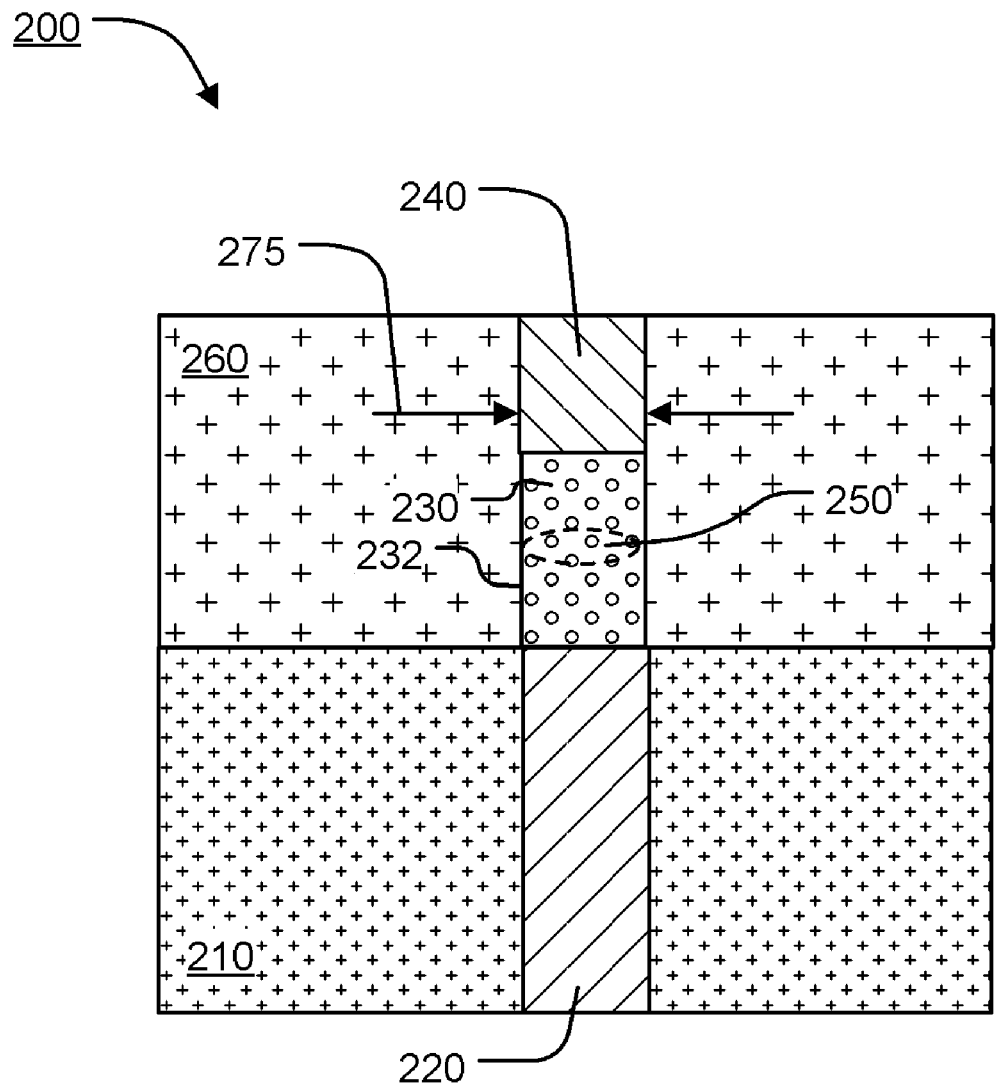
FIG. 2 illustrates a cross-sectional view of a prior art "pillar-type" memory cell.

FIG. 2 illustrates a cross-sectional view of a prior art "pillar-type" memory cell 200. The memory cell 200 includes a bottom electrode 220 in a dielectric layer 210, a pillar of phase change material 230 on the bottom electrode 220, and a top electrode 240 on the pillar of phase change material 230. A dielectric layer 260 surrounds the pillar of phase change material 230. As can be seen in the Figure, the top and bottom electrodes 240, 220 have the same width 275 as that of the pillar of phase change material 230. Thus, the active region 250 can be spaced away from the top and bottom electrodes 240, 220, resulting in a reduced heat sink effect by the top and bottom electrodes 240, 220. However, there is heat loss through the sidewalls 232 of the phase change material 230 to the dielectric layer 260 due to the proximity of the active region 250 to the dielectric layer 260.

It is desirable to minimize the width 275 of the pillar of phase change material 230 so that higher current densities are achieved with small absolute current values through the phase change material 230. The pillar of memory material 230 and the top electrode 240 can be formed by depositing a phase change material layer and a layer of top electrode material, and then etching. However problems have arisen in manufacturing devices having small widths 275 and aggressive aspect ratios due to issues with undercut etching and/or overetching. This can result in etch damage to the to the sidewalls 232 of the pillar of memory material 230, as well as alignment tolerance issues between the pillar of memory material 230 and the bottom electrode 220.

Figure 3A:
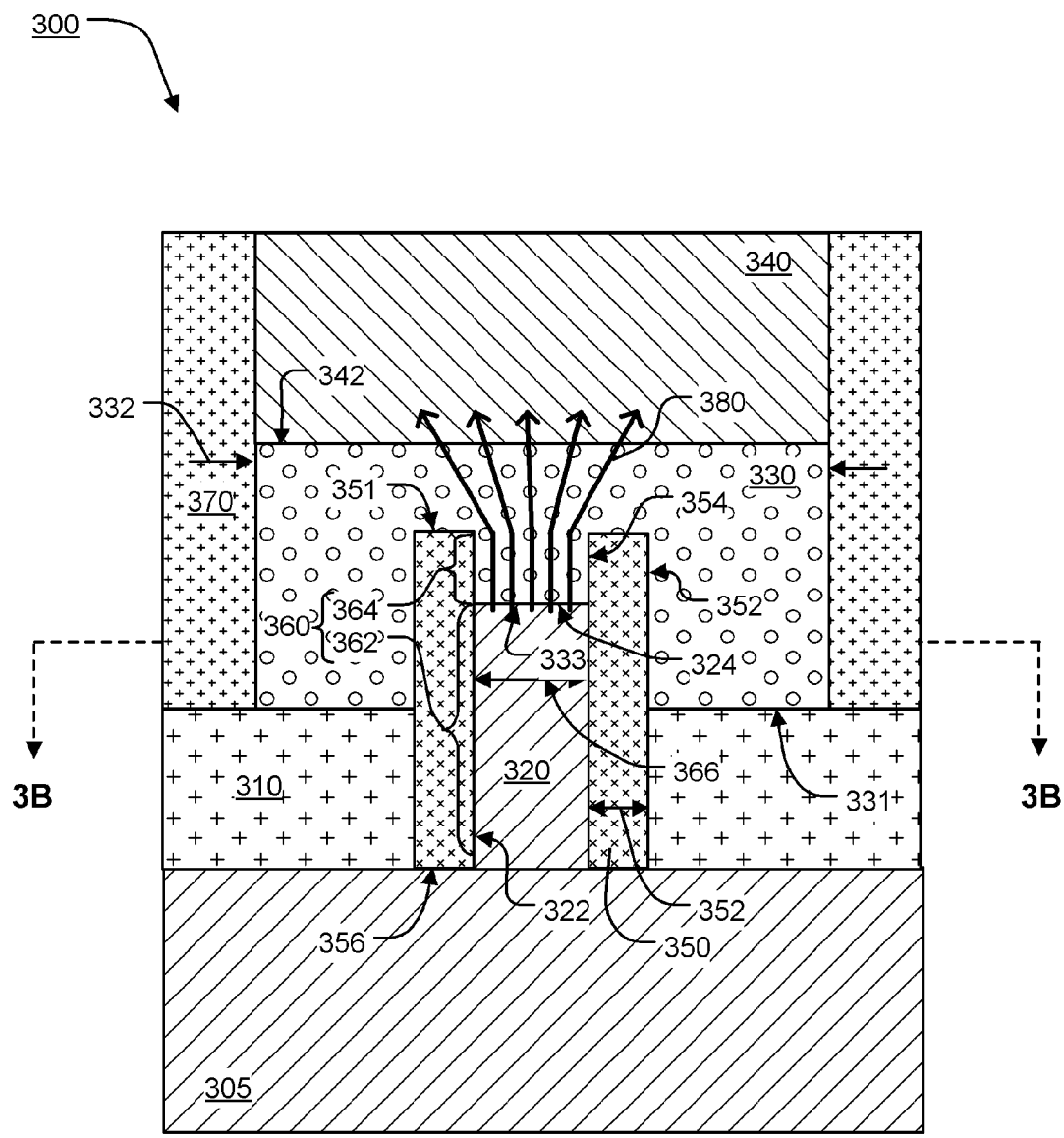
FIGS. 3A and 3B are cross-sectional and top views respectively of an embodiment of a memory cell described herein.

FIG. 3A is a cross-sectional view of an embodiment of a memory cell 300 as described herein having a small operating current and addressing the various issues described above.

The memory cell 300 includes a conductive contact 305 and a programmable resistance memory element 330 overlying the conductive contact 305. The conductive contact 305 couples the memory cell 300 to underlying access circuitry (not shown) such as a transistor or diode. The conductive contact 305 comprises a refractory metal such as tungsten in the illustrated embodiment. Other metals that could be used include Ti, Mo, Al, Ta, Cu, Pt, Ir, La, Ni, and Ru. Other contact structures and materials can be used as well. For example, the conductive contact 305 may be a silicide or may comprise a doped semiconductor material which is a drain or source region of an access transistor or a terminal of a diode.

The memory element 330 comprises programmable resistance memory material and may comprise, for example, one or more materials from the group of Zn, To, Tl, Ge, Sb, Te, Se, In, Ti, Ga, Bi, Sn, Cu, Pd, Pb, Ag, S, Si, O, P, As, N and Au.

The memory cell 300 also includes a pipe shaped insulator element 350 extending from the conductive contact 305 into the memory element 330. The insulator element 350 has a proximal end 356 adjacent the conductive contact 305 and a distal end 351. The insulator element 350 also has an inside surface 354 defining an interior 360. The insulator element 350 comprises dielectric material, and in the illustrated embodiment comprises $Al_2O_3$. Alternatively, the insulator element 350 may comprise other dielectric materials, for example $SiO_2$ or SiN.

A bottom electrode 320 contacts the conductive contact 305 and extends upwardly within a bottom portion 362 of the interior 360 from the proximal end 356. The inside surface 354 of the insulator element 350 extends above the top surface 324 of the bottom electrode 320 to define an upper portion 364 of the interior 360. In the illustrated embodiment the upper and lower portions 364, 362 have substantially the same width 366. As used herein, the term "substantially" is intended to accommodate manufacturing tolerances during the formation of the insulator element 350.

The bottom electrode 320 has an outer surface 322 surrounded by the inside surface 354 of the insulator element 350. The bottom electrode 320 may comprise, for example, for example, TiN or TaN. TiN may be preferred in embodiments in which the memory element 330 comprises GST (discussed below) because is makes a good contact with GST, it is a common material used in semiconductor manufacturing, and it provides a good diffusion barrier at the higher temperatures at which GST transitions, typically in the 600-700° C. range. Alternatively, the bottom electrode 320 may be W, WN, TiAlN or TaAlN, or comprise, for further examples, one or more elements selected from the group consisting of doped-Si, Si, Ge, C, Ge, Cr, Ti, W, Mo, Al, Ta, Cu, Pt, Ir, La, Ni, N, O, and Ru and combinations thereof.

Figure 3B:
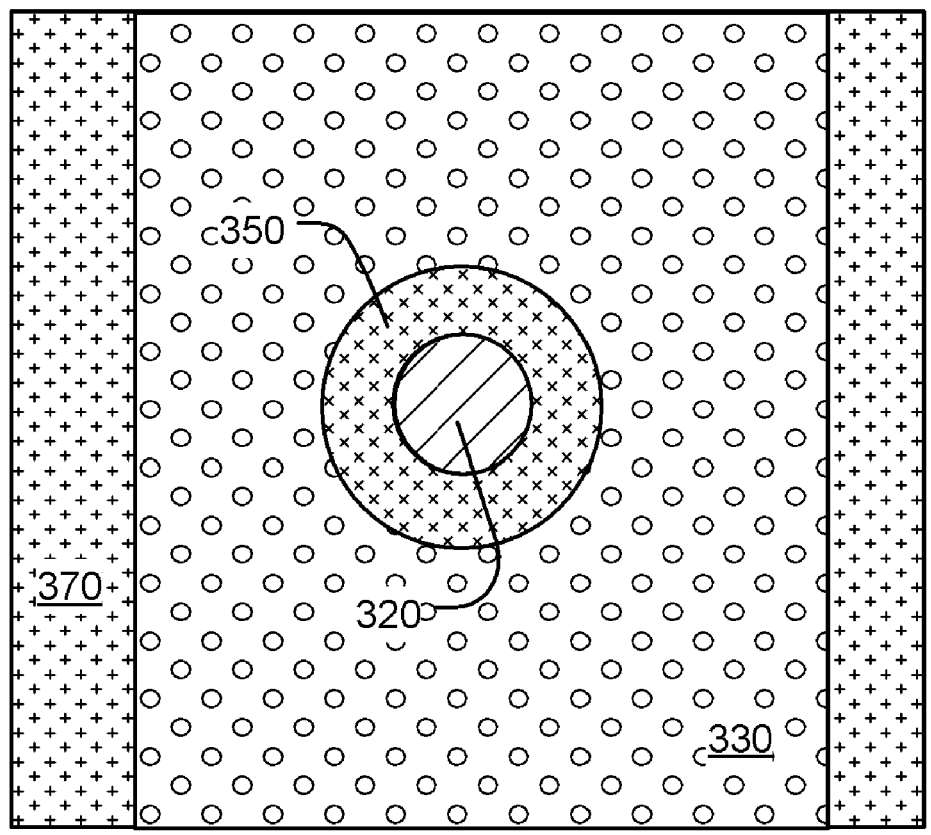

As shown in the top view of FIG. 3B, in the illustrated embodiment the bottom electrode 320 and the insulator element 350 each have a circular cross-section. However, in embodiments the bottom electrode 320 and the insulator element 350 may respectively have a cross-section that is circular, elliptical, square, rectangular or somewhat irregularly shaped, depending on the manufacturing technique applied to form the bottom electrode 320 the insulator element 350.

Referring back to the cross-section of FIG. 3A, the memory element 330 includes a portion within the upper portion 364 of the interior 360 extending downwardly from the distal end 351 to contact the top surface 324 of the bottom electrode 320 at a first contact surface 333.

The memory element 330 also extends below the top surface of the insulator element 350 to contact the outer surface 352 of the insulator element 350, and has a bottom surface 331 lying below the top surface 324 of the bottom electrode 320. As a result, the memory element 330 surrounds portions of the insulator element 350 and the bottom electrode 320.

The memory element 330 is on dielectric 310. The dielectric 310 may comprise, for example, $SiO_2$. Alternatively, the dielectric 310 may comprise other materials.

The memory cell 300 also includes a top electrode 340 separated from the distal end 351 of the insulator element 350 by memory material of the memory element 330. The top electrode 340 contacts the memory element 330 at a second contact surface 342. The second contact surface 342 has a surface area greater than that of the first contact surface 333.

The top electrode 340 may comprise, for example, any of the materials discussed above with reference to the bottom electrode 320. In some embodiments the top electrode 340 may comprise more than one layer. For example, the top electrode 340 may comprise a first material contacting the memory element 330 and chosen for compatibility with the material of memory element 330, and a second material on the first and chosen for other advantages such as a lower electrical resistivity. In some embodiments the top electrode 340 may comprise a portion of a bit line. The top electrode 340 and memory element 330 are surrounded by dielectric 370 comprising, for example, $SiO_2$. Alternatively, the dielectric 370 may comprise other materials.

In operation, voltages on the top electrode 340 and the bottom electrode 320 induce a current to flow along path 380 from the top electrode 340 to the bottom electrode 320, or vice versa, through the memory element 330 via contact surfaces 333, 342.

The active region is the portion of the memory element 330 within the upper portion 364 of the interior 360 in which the memory material is induced to change between at least two solid phases. As can be appreciated, the active region can be made extremely small in the illustrated structure, thus reducing the magnitude of the current needed to induce a phase change. The width 366 of the interior 360 is less than the width 332 of the memory element 330 and top electrode 340, the width 366 preferably less than a minimum feature size for a process, typically a lithographic process, used to form the memory cell 300. The difference in widths 332 and 366 confines current in the portion of the memory element 330 within the upper portion 364 of the interior 360, thereby reducing the magnitude of current needed to induce a phase change in the active region.

In addition, the bottom electrode 320 can act as a heater, because of its high resistivity in certain embodiments, inducing a greater temperature change in the active region for a given current flow than would otherwise occur, thus improving the efficiency of the phase change in the active region.

Furthermore, the small width 366 of the bottom electrode 320 provides a high thermal resistance path through the bottom electrode 320, thus restricting the amount of heat flow away from the active region of the memory element 330 through the bottom electrode 320.

Since the memory element 330 surrounds the outer surface 352 of the insulator element 350 and extends below the top surface 324 of the bottom electrode 320, the active region is inside the volume of memory material of the memory element 330. The remaining portions of the memory element 330 can therefore provide thermal isolation to the active region, which reduces the amount of current necessary to induce a phase change. In embodiments the memory material of the memory element 330 can have a thermal conductivity (k) in the highest thermal conductivity state less than that of the dielectric materials 310, 350, and 370. Thus, by having the active region inside the volume of memory material, in embodiments the memory element 330 can provide greater thermal isolation to the active region than would be provided by dielectric materials, thus reducing the amount of current necessary to induce a phase change.

In addition, having the active region within the upper portion 364 of the interior 360, and thus spaced away from the outside surfaces of memory element 330, prevents etch damage issues to the active region.

The insulator element 350 can also provide some thermal isolation to the active region. Additionally, in embodiments the insulator element 350 can be formed on a sidewall using thin film deposition techniques, and thus the thickness 352 of the insulator element 350 can be very small. The small thickness 352 increases the thermal resistance of the insulator element 350, which restricts heat flow away from the active region by the insulator element 350 and thereby helps to concentrate the heat flow to within the material of the memory element 330.

FIGS. 4 to 9 illustrate steps in a fabrication sequence suitable for manufacturing the memory cell 300 of FIGS. 3A-3B.

Figure 4:
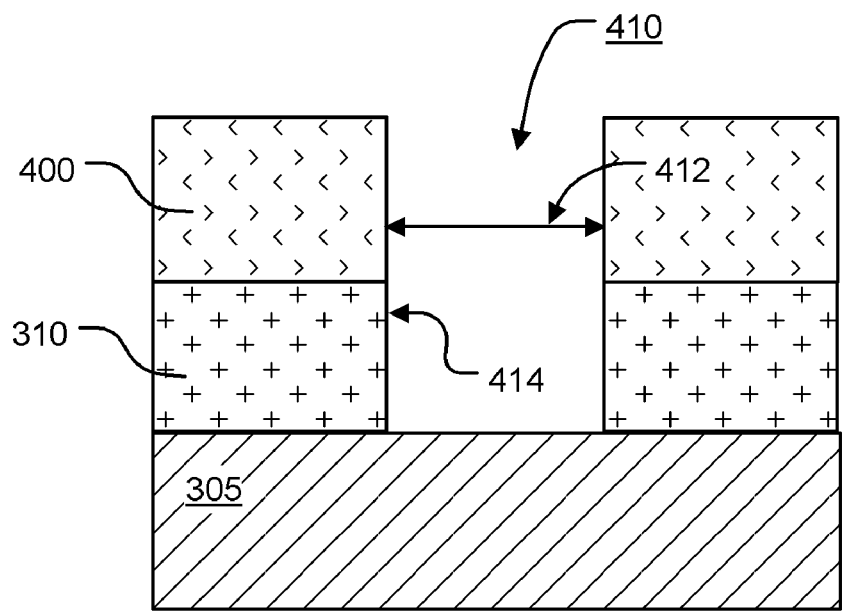
FIGS. 4 to 9 illustrate steps in a fabrication sequence suitable for manufacturing the memory cell of FIGS. 3A-3B.

FIG. 4 illustrates a first step of forming dielectric 310 on conductive contact 305, forming a sacrificial material layer 400 on dielectric 310, and forming a via 410 in the material layer 400 and dielectric 310, the via 410 having a sidewall surface 414. The material layer 400 comprises material that can be selectively processed (e.g. selectively etched) relative to the material of dielectric 310 and the subsequently formed sidewall insulator element 350. The material layer 400 may comprise, for example $SiO_2$, while dielectric and the subsequently formed sidewall insulator element 350 may each comprise SiN.

The via 410 having a sublithographic width 412 can be formed, for example, by forming an isolation layer on the layer 400 and forming a sacrificial layer on the isolation layer. Next, a mask having an opening close to or equal to the minimum feature size of the process used to create the mask is formed on the sacrificial layer, the opening overlying the location of the via 41 0. The isolation layer and the sacrificial layer are then selectively etched using the mask, thereby forming a via in the isolation and sacrificial layers and exposing a top surface of the layer 400. After removal of the mask, a selective undercutting etch is performed on the via such that the isolation layer is etched while leaving the sacrificial layer and the layer 400 intact. A fill material is then formed in the via, which due to the selective undercutting etch process results in a self-aligned void in the fill material being formed within the via. Next, an anisotropic etching process is performed on the fill material to open the void, and etching continues until the layer 400 is exposed in the region below the via, thereby forming a sidewall spacer comprising fill material within the via. The sidewall spacer has an opening dimension substantially determined by the dimension of the void, and thus can be less than the minimum feature size of a lithographic process. Next, the layer 400 and dielectric 310 are etched using the sidewall spacer as an etch mask, thereby forming via 410 having a width 412 less than the minimum lithographic feature size. The isolation layer and the sacrificial layer can be removed by a planarization process such as Chemical Mechanical Polishing (CMP).

Figure 5:
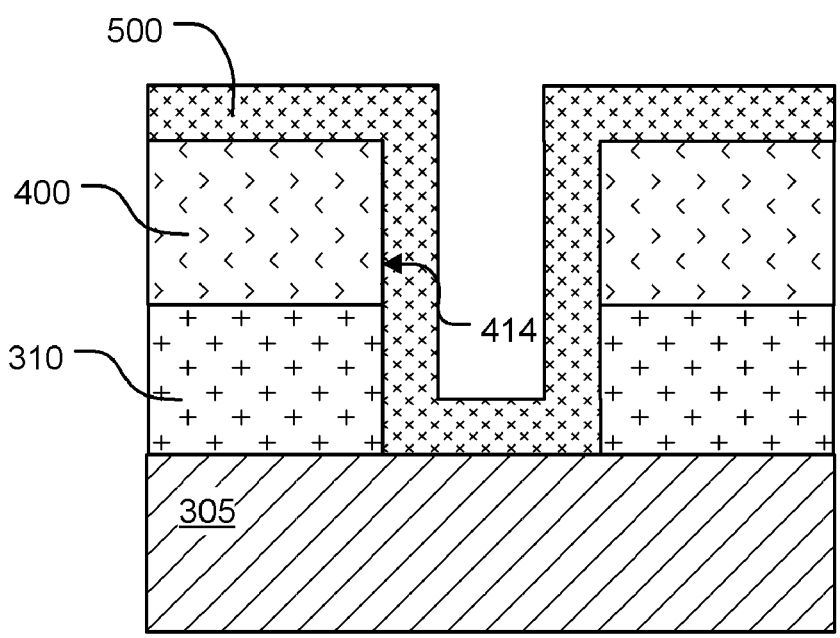

Next, a layer 500 of insulator material is formed on the structure illustrated in FIG. 4, including within the via 410, resulting in the structure illustrated the cross-sectional view of FIG. 5. As can be seen in the FIG. 4, the layer 500 is conformal with the via 410 and is on the sidewall 414. The layer 500 can be formed, for example, by chemical vapor deposition (CVD) or atomic layer deposition (ALD).

Figure 6:
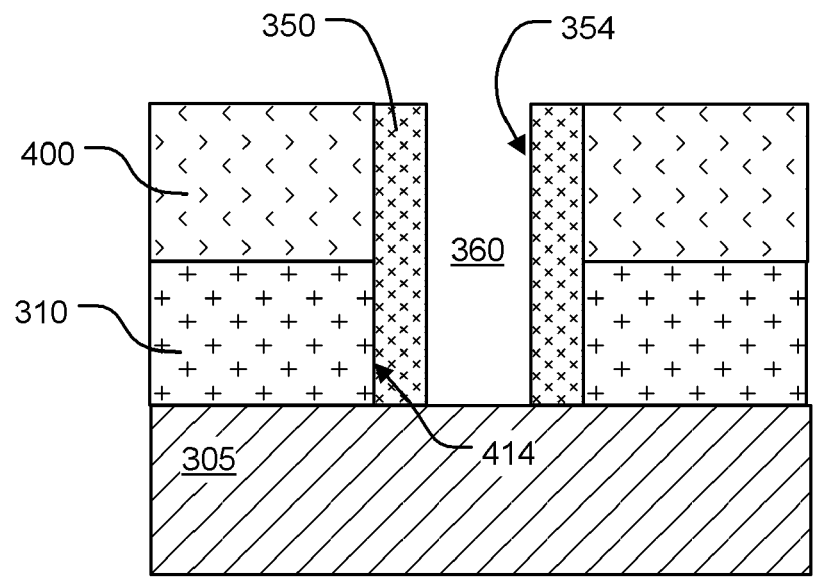

Next, the layer 500 of insulator material of the structure of FIG. 5 is anisotropically etched to form the insulator element 350 on the sidewall 414 of the via 410, resulting in the structure illustrated in the cross-sectional view of FIG. 6. The insulator element 350 has an inner surface 354 defining an interior 360.

Figure 7:
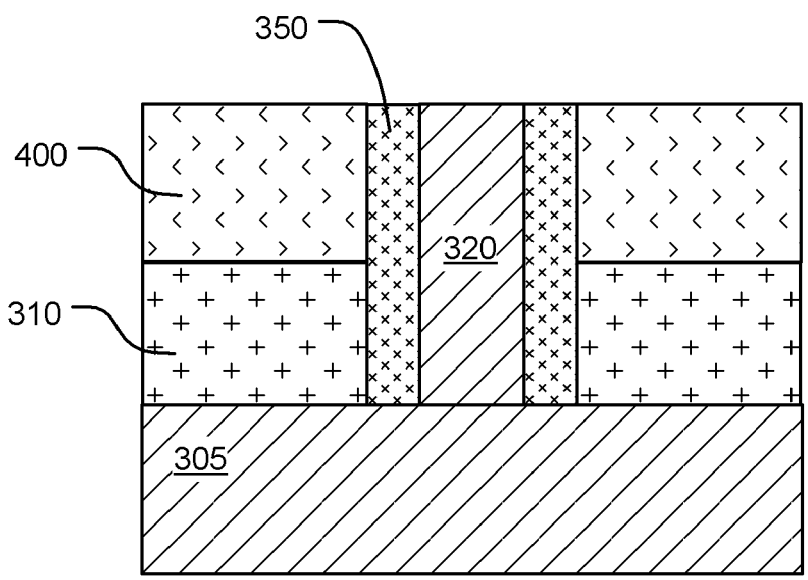

Next, bottom electrode 320 is formed within the interior 360 of the insulator element 350 of the structure illustrated in FIG. 6, resulting in the structure illustrated in the cross-sectional view of FIG. 7. The bottom electrode 320 can be formed, for example, by depositing a layer of bottom electrode material on the structure illustrated in FIG. 6, followed by a planarization process such as Chemical Mechanical Polishing (CMP) to expose the top surface of the material layer 400.

Next, a portion of the bottom electrode 320 is etched from the structure illustrated in FIG. 7, resulting in the bottom electrode 320 having a top surface 324 below the top surface 351 of the insulator element 350 as illustrated in the cross-sectional view of FIG. 8. The etching of a portion of the bottom electrode 320 results in the upper portion 364 of the interior 360 being self-aligned with the remaining portion of the bottom electrode 320 within the lower portion 362. As a result, the memory material subsequently formed within the interior is self-aligned with the bottom electrode 320.

Figure 8:
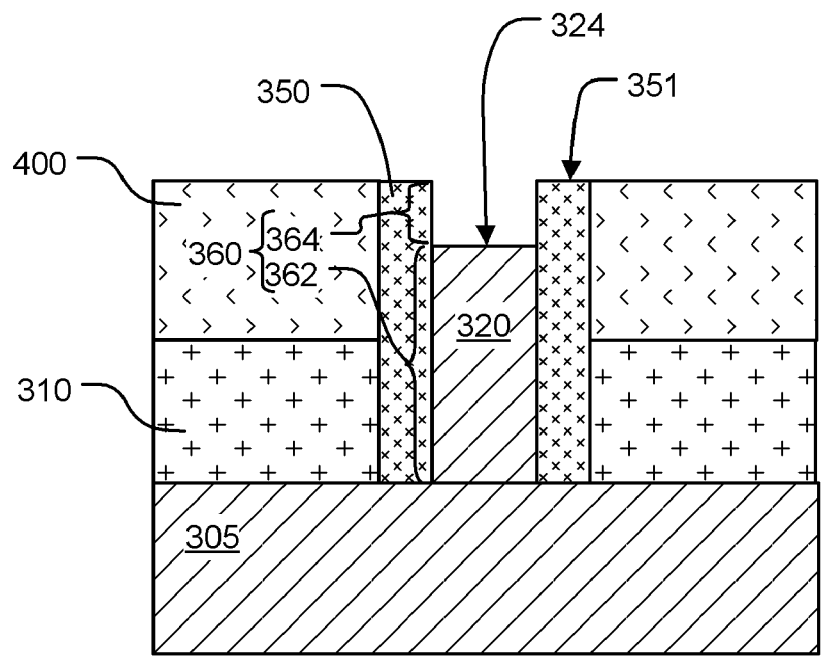
Figure 9:
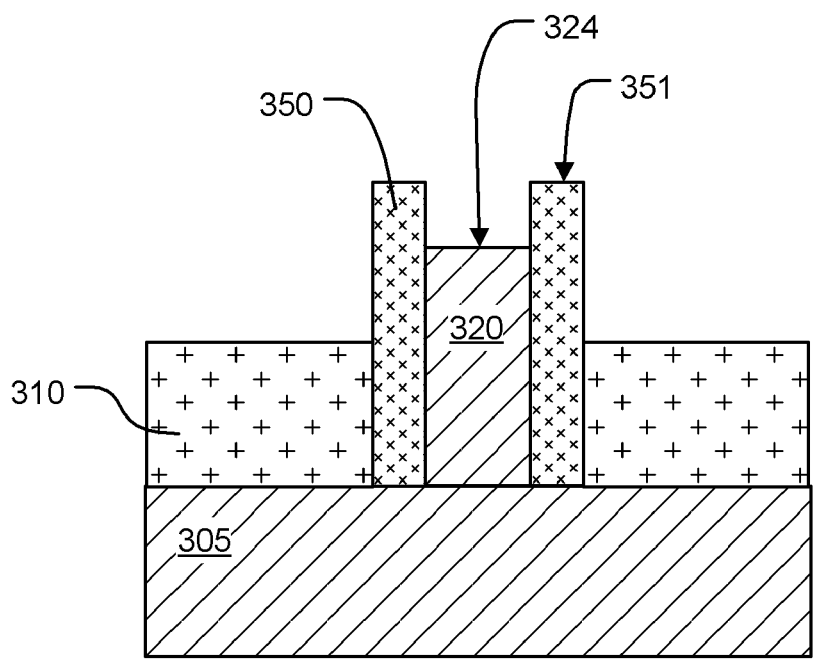

Next, material layer 400 is selectively etched from the structure illustrated in FIG. 8 to expose the outer surface 352 of the insulator element 350, and the top surface of the bottom electrode 320 is cleaned, resulting in the structure illustrated in the cross-sectional view of FIG. 9. In the illustrated embodiment the material layer 400 is $SiO_2$ and the insulator element 350 and layer 310 are SiN, and the selective etching may be performed, for example, using HF.

Next, phase change material is deposited on the structure illustrated in FIG. 9, top electrode material is deposited on the phase change material, and the phase change material and top electrode material are patterned to form the memory element 330 and top electrode 340 respectively, resulting in the memory cell 300 of FIGS. 3A-3B.

Figure 10:
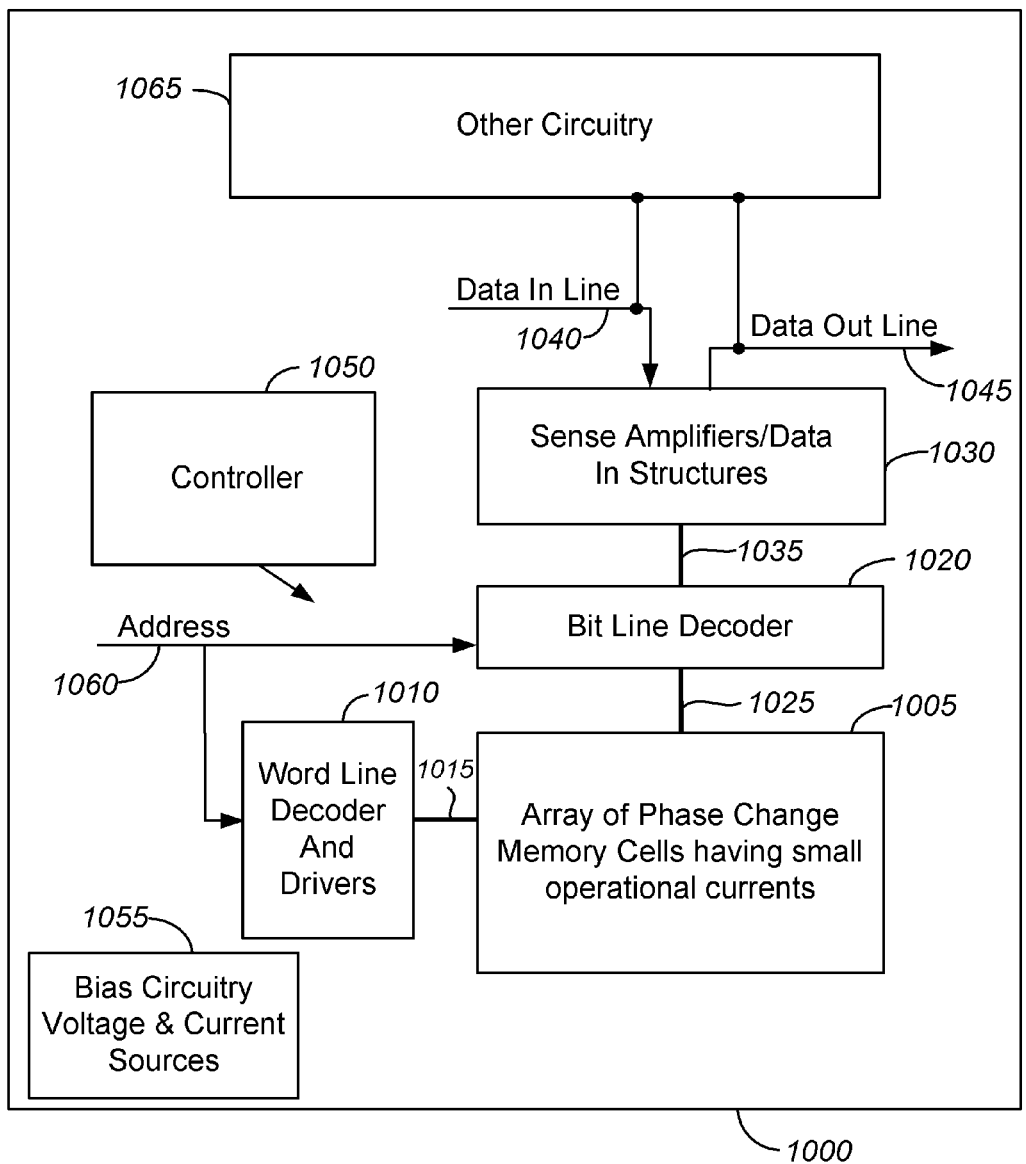
FIG. 10 is a simplified block diagram of an integrated circuit in which the memory cells described herein can be implemented.

FIG. 10 is a simplified block diagram of an integrated circuit 1000 including a memory array 1005 having memory cells as described herein having small operational currents, the memory cells including phase change memory elements programmable to a plurality of resistance states including a lower resistance state and a higher resistance state. A word line decoder 1010 having read, reset, reset verify, set verify, and set modes is coupled to and in electrical communication with a plurality of word lines 1015 arranged along rows in the memory array 1005. A bit line (column) decoder 1020 is in electrical communication with a plurality of bit lines 1025 arranged along columns in the array 1005 for reading and programming the memory cells (not shown) in array 1005.

Addresses are supplied on bus 1060 to word line decoder and drivers 1010 and bit line decoder 1020. Sense circuitry (Sense amplifiers) and data-in structures in block 1030, including voltage and/or current sources for the read and program modes are coupled to bit line decoder 1020 via data bus 1035. Data is supplied via a data-in line 1040 from input/output ports on integrated circuit 1000, or from other data sources internal or external to integrated circuit 1000, to data-in structures in block 1030. Other circuitry 1065 may be included on integrated circuit 1000, such as a general purpose processor or special purpose application circuitry, or a combination of modules providing system-on-a-chip functionality supported by array 1005. Data is supplied via a data-out line 1045 from the sense amplifiers in block 1030 to input/output ports on integrated circuit 1000, or to other data destinations internal or external to integrated circuit 1000.

The integrated circuit 1000 includes a controller 1050 for read, reset, reset verify, set verify, and set modes of the memory cells of the array 1005. The controller 1050, implemented in this example using a bias arrangement state machine, controls the application of bias circuitry voltage & current sources 1055 for the application of bias arrangements including read, set and reset to the word lines 1015, bit lines 1025, and in some embodiments source lines. Controller 1050 may be implemented using special-purpose logic circuitry as known in the art. In alternative embodiments, controller 1050 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1050.

Figure 11:
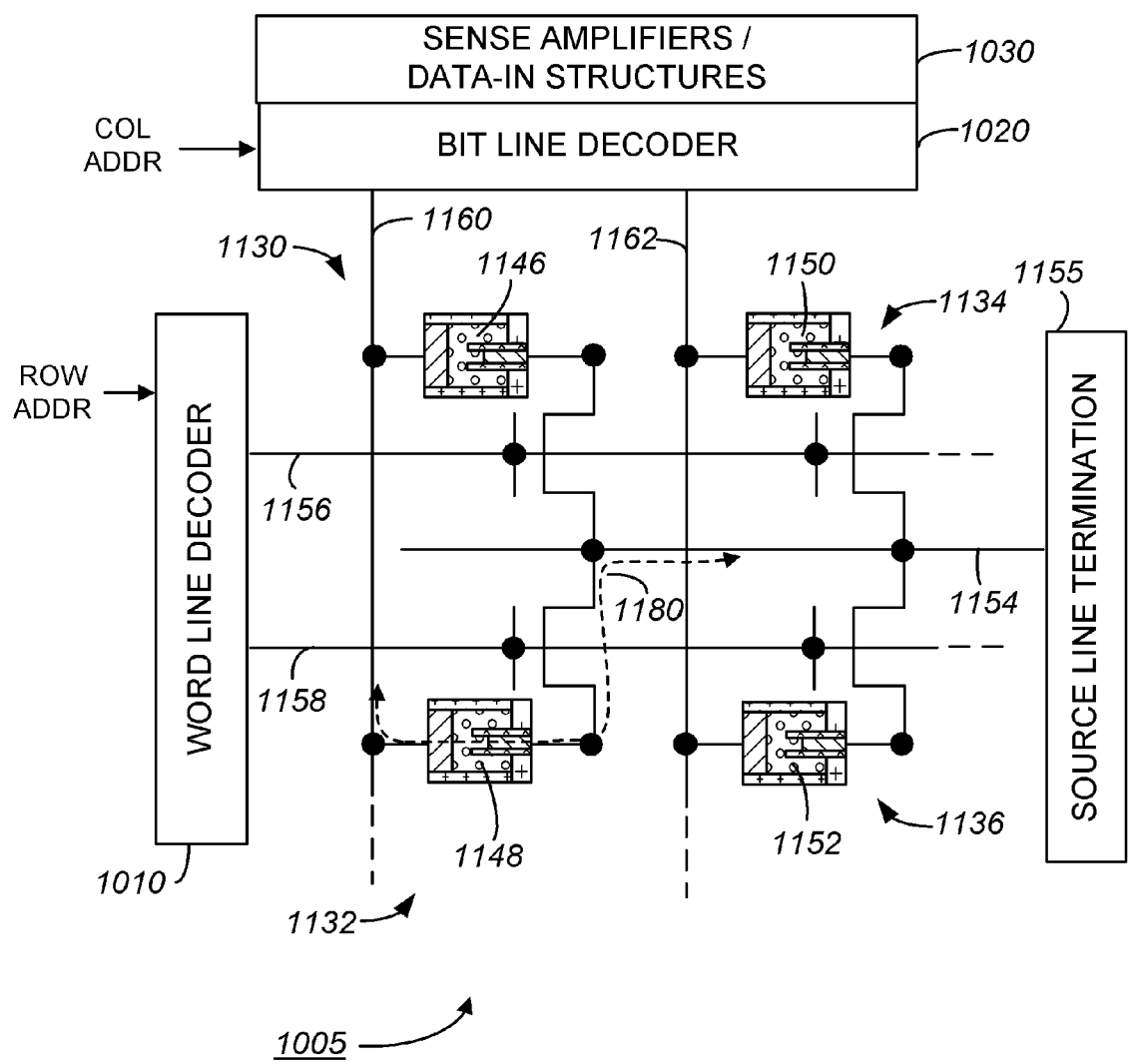
FIG. 11 is a schematic diagram of a portion of an embodiment of the memory array of the integrated circuit of FIG. 10.

As shown in FIG. 11, each of the memory cells of array 1005 includes an access transistor (or other access device such as a diode) and a phase change memory element. In FIG. 11 four memory cells 1130, 1132, 1134, 1136 having respective memory elements 1140, 1142, 1144, 1146 are illustrated, representing a small section of an array that can include millions of memory cells. The memory elements are programmable to a plurality of resistance states including a lower and a higher resistance state.

Sources of each of the access transistors of memory cells 1130, 1132, 1134, 1136 are connected in common to source line 1154 that terminates in source line termination circuit 1155, such as a ground terminal. In another embodiment the source lines of the access devices are not electrically connected, but independently controllable. The source line termination circuit 1155 may include bias circuitry such as voltage sources and current sources, and decoding circuits for applying bias arrangements, other than ground, to the source line 1154 in some embodiments.

A plurality of word lines including word lines 1156, 1158 extend in parallel along a first direction. Word lines 1156, 1158 are in electrical communication with word line decoder 1010. The gates of access transistors of memory cells 1130 and 1134 are connected to word line 1156, and the gates of access transistors of memory cells 1132 and 1136 are connected in common to word line 1158.

A plurality of bit lines including bit lines 1160, 1162 extend in parallel in a second direction and are in electrical communication with bit line decoder 1120. In the illustrated embodiment each of the memory elements are arranged between the drain of the corresponding access device and the corresponding bit line. Alternatively, the memory elements may be on the source side of the corresponding access device.

It will be understood that the memory array 1105 is not limited to the array configuration illustrated in FIG. 11, and additional array configurations can also be used. Additionally, instead of MOS transistors, bipolar transistors or diodes may be used as access devices in some embodiments.

In operation each of the memory cells in the array 1105 store data depending upon the resistance of the corresponding memory element. The data value may be determined, for example, by comparison of current on a bit line for a selected memory cell to that of a suitable reference current by sense amplifiers of sense circuitry 1 130. The reference current can be established to that a predetermined range of currents correspond to a logical "0", and a differing range of currents correspond to a logical "1". In a memory cell having three or more states, reference currents can be established so that differing ranges of bit line currents correspond to each of the three or more states.

Reading, or writing to a memory cell of array 1105 can be achieved by applying a suitable voltage to one of word lines 1156, 1158 and coupling one of bit lines 1160, 1162 to a voltage so that current flows through the selected memory cell. For example, a current path 1180 through a selected memory cell (in this example memory cell 1132 and corresponding memory element 1148) is established by applying voltages to the bit line 1160, word line 1158, and source line 1154 sufficient to turn on the access transistor of memory cell 1132 and induce current in path 1180 to flow from the bit line 1160 to the source line 1154, or vice-versa. The level and duration of the voltages applied is dependent upon the operation performed.

In a reset (or erase) operation of memory cell 1132, word line decoder 1010 facilitates providing word line 1158 with a suitable voltage to turn on the access transistor of the memory cell 1132. Bit line decoder 1020 facilitates supplying one or more voltage pulses to bit line 1160 of suitable amplitude and duration to induce a current to flow though memory element 1148, thereby raising the temperature of at least the active region above the transition temperature of the phase change material of the memory element 1148 and also above the melting temperature to place at least the active region in a liquid state. The current is then terminated, for example by terminating the voltage pulse on the bit line 1160 and the voltage on the word line 1158, resulting in a relatively quick quenching time as the active region rapidly cools to stabilize to an amorphous phase.

In a read (or sense) operation of memory cell 1132, word line decoder 1010 facilitates providing word line 1158 with a suitable voltage to turn on the access transistor of the memory cell 1132. Bit line decoder 1120 facilitates supplying a voltage to bit line 1160 of suitable amplitude and duration to induce current to flow that does not result in the memory element 1 148 undergoing a change in resistive state. The current on the bit line 1160 and through the memory element 1148 is dependent upon the resistance of, and therefore the data state associated with, the memory element 1148 of the memory cell 1132. Thus, the data state of the memory cell 1132 may be determined, for example by comparison of the current on bit line 1160 with a suitable reference current by sense amplifiers of sense circuitry 1030.

In a set (or program) operation of memory cell 1132, word line decoder 1010 facilitates providing word line 1158 with a suitable voltage to turn on the access transistor of the memory cell 1132. Bit line decoder 1020 facilitates supplying a voltage to bit line 1160 of suitable amplitude and duration to induce current to flow through the memory element 1148, thereby raising the temperature of a least a portion of the active region above the transition temperature of the phase change material to cause a transition of at least a portion of the active region from the amorphous phase to the crystalline phase, this transition lowering the resistance of the memory element 1148 and setting the memory cell 1132 to the desired state.

Embodiments of memory material of the memory elements described herein include phase change based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), $NiO$, $Nb_2O_5$, $CuO_2$, $Ta_2O_5$, $Al_2O_3$, $CoO$, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
   a conductive contact;
   a memory element comprising programmable resistance memory material overlying the conductive contact;
   an insulator element extending from the conductive contact into the memory element to surround a first portion of the memory element and to be at least partially surrounded by a second portion of the memory element, the insulator element having proximal and distal ends and an inside surface defining an interior, the proximal end adjacent the conductive contact; and
   a bottom electrode between the first portion of the memory element and the conductive contact, the bottom electrode contacting the conductive contact and extending upwardly within the interior from the proximal end, the memory element within the interior extending downwardly from the distal end to contact a top surface of the bottom electrode at a first contact surface.

2. The memory device of claim 1, wherein the memory element has a bottom surface lying below the top surface of the bottom electrode.

3. The memory device of claim 1, wherein the memory element within the interior is self-aligned with the bottom electrode.

4. The memory device of claim 1, wherein the interior has a width less than a minimum feature size for a lithographic process used to form the memory device.

5. The memory device of claim 1, further comprising a top electrode separated from the distal end of the insulator element by the memory element and contacting the memory element at a second contact surface, the second contact surface having a surface area greater than that of the first contact surface.

6. The memory device of claim 1, wherein the memory element comprises material having a thermal conductivity less than that of material of the insulator element.

7. The memory device of claim 1, wherein the interior has substantially the same width at the proximal and distal ends.

8. A method for manufacturing a memory device, the method comprising:
   forming a conductive contact;
   forming an insulator element having proximal and distal ends and an inside surface defining an interior, the proximal end adjacent the conductive contact;
   forming a bottom electrode contacting the conductive contact and extending upwardly within the interior from the proximal end, the bottom electrode having a top surface within the interior; and
   forming a memory element comprising programmable resistance memory material overlying the conductive contact and on the insulator element, the memory element surrounding an outer surface of the insulator element and extending within the interior downwardly from the distal end to contact the top surface of the bottom electrode at a first contact surface.

9. The method of claim 8, wherein the memory element has a bottom surface lying below the top surface of the bottom electrode.

10. The method of claim 8, wherein forming the bottom electrode comprises:
    filling the interior defined by the inside surface of the insulator element with bottom electrode material; and
    removing the bottom electrode material from an upper portion of the interior to form the bottom electrode.

11. The method of claim 8, wherein the interior has a width less than a minimum lithographic feature size for a lithographic process used to form the memory device.

12. The method of claim 8, further comprising forming a top electrode separated from the distal end of the insulator element by the memory element and contacting the memory element at a second contact surface, the second contact surface having a surface area greater than that of the first contact surface.

13. The method of claim 8, wherein the memory element comprises material having a thermal conductivity less than that of material of the insulator element.

14. The method of claim 8, wherein the interior has substantially the same width at the proximal and distal ends.

15. The method of claim 8, wherein forming the insulator element comprises:

forming a first material layer and forming a second material layer on the first material layer;

forming a via in the first and second material layers to expose the conductive contact, the via having a sidewall; and forming the insulator element on the sidewall of the via.

16. The method of claim 15, wherein forming the insulator element on the sidewall of the via comprises:

depositing a layer of insulator material within the via including on the sidewall of the via; and anisotropically etching the insulator material.

17. The method of claim 15, wherein forming the bottom electrode and forming the memory element comprise:

filling the interior defined by the inner surface of the insulator element with bottom electrode material;

removing the bottom electrode material from the upper portion of the interior to form the bottom electrode from remaining bottom electrode material;

removing the second material layer to expose the outside surface of the insulator element; and depositing memory material within the upper portion of the interior and on the exposed outside surface of the insulator element.

18. The method of claim 8, wherein forming the insulator element and forming the bottom electrode comprise:

forming the insulator element on a sidewall of a via;

filling the interior defined by the inner surface of the insulator element with bottom electrode material; and removing the bottom electrode material from the upper portion of the interior to form the bottom electrode from remaining bottom electrode material.

19. A memory device comprising:

a pipe shaped insulator element having an inside surface defining an interior, and having an outer surface;

a first electrode within a lower portion of the interior, the first electrode having a top surface within the interior;

a memory element comprising programmable resistance memory material at least partially surrounding a portion of the insulator element and located within an upper portion of the interior, the memory element contacting the top surface of the first electrode at a first contact surface, the memory element having an active region within the upper portion; and a second electrode contacting the memory element at a second contact surface.

\* \* \* \* \*